(12) United States Patent
Aschner et al.

(10) Patent No.: US 6,449,428 B2
(45) Date of Patent: *Sep. 10, 2002

(54) GAS DRIVEN ROTATING SUSCEPTOR FOR RAPID THERMAL PROCESSING (RTP) SYSTEM

(75) Inventors: Helmut Aschner, Beimerstetten; Andreas Hauke, Neu Ulm; Karsten Weber, Leutenbach; Dieter Zernickel, Amstetten, all of (DE)

(73) Assignee: Mattson Technology Corp., Freemont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,735

(22) Filed: Dec. 11, 1998

(51) Int. Cl.[7] ............................................. F27D 11/00
(52) U.S. Cl. .................. 392/418; 219/390; 219/405; 219/411; 392/416
(58) Field of Search ................. 392/418, 416; 219/390, 405, 411; 118/724–725, 50.1, 730, 500, 728

(56) References Cited

U.S. PATENT DOCUMENTS

| | | | | |
|---|---|---|---|---|
| 3,721,210 A | * | 3/1973 | Helms et al. | 118/725 |
| 4,560,420 A | * | 12/1985 | Lord | 438/795 |
| 4,860,687 A | * | 8/1989 | Frijlink | 118/500 |
| 5,027,746 A | * | 7/1991 | Frijlink | 118/724 |
| 5,226,383 A | * | 7/1993 | Bhat | 118/730 |
| 5,489,192 A | * | 2/1996 | Taniguchi | 118/728 |
| 5,527,393 A | | 6/1996 | Sato et al. | 118/725 |
| 5,788,777 A | * | 8/1998 | Burk, Jr. | 118/730 |
| 5,982,986 A | * | 11/1999 | Davenport | 392/418 |
| 6,005,226 A | * | 12/1999 | Aschner et al. | 219/390 |
| 6,007,635 A | * | 12/1999 | Mahawili | 118/728 |
| 6,113,702 A | * | 9/2000 | Halpin et al. | 118/725 |
| 6,163,648 A | * | 12/2000 | Moto et al. | 392/418 |

FOREIGN PATENT DOCUMENTS

| | | | |
|---|---|---|---|
| DE | 3608783 | * | 9/1987 |
| JP | 56-54033 | | 5/1981 |
| JP | 61-1017 | * | 1/1986 |
| JP | 62-260316 | * | 11/1987 |
| JP | 62-296419 | * | 12/1987 |
| JP | 63-257221 | * | 10/1988 |
| JP | 64-7616 | | 1/1989 |
| JP | 2-159720 | | 6/1990 |
| JP | 3-6018 | | 1/1991 |
| JP | 4-50194 | * | 2/1992 |
| JP | 5-102077 | * | 4/1993 |
| JP | 6-260422 | | 9/1994 |
| JP | 7-66126 | | 3/1995 |
| JP | 9-115845 | * | 5/1997 |
| WO | 9716847 | * | 5/1997 |

* cited by examiner

*Primary Examiner*—Teresa Walberg
(74) *Attorney, Agent, or Firm*—Rodney T Hodgson (57) ABSTRACT

Air bearings support a rotating wafer carrying base in an RTP system. The base in proximity to the air bearing is protected from warping due to absorption of radiation from the hot wafer being treated. The most preferred embodiment splits the base into an inner disk carrying the wafer and an outer ring, where the inner ring which absorbs the most energy contacts and is supported at three points by the outer disk which is supported by the air bearing.

11 Claims, 7 Drawing Sheets

GAS DRIVEN ROTATING SUSCEPTOR FOR RAPID THERMAL PROCESSING (RTP) SYSTEM

FIELD OF THE INVENTION.

The present invention relates to a system, apparatus, and method for more uniformly heating objects in a Rapid Thermal Processing (RTP) system. More specifically, the present invention discloses a convenient, inexpensive way to rotate semiconductor wafers treated in such system.

BACKGROUND OF THE INVENTION

The major problem faced by the field of RTP has been the uniformity of heating of the semiconductor wafers treated in the RTP systems. RTP systems generally have a chamber with at least one wall transparent to radiation from sources of radiation such as lamps. The object to be processed is placed in the chamber and irradiated with radiation from the radiation source so that the object is heated. The chamber with the transparent wall is not strictly necessary in the system, provided that the system controls the atmosphere in which the object is placed during processing. The lamps could then be placed in proximity to the object without the intervening window. Much progress has been made in using batteries of lamps with individual control of each lamp to increase uniformity of the illuminating radiation. However, the uniformity of the resulting material is not sufficient for present and future demands from the industry.

One way to increase the uniformity of result in such systems is to rotate the substrate under the lamps. Many prior art systems have been published to effect this rotation. However, these many systems generally used only one bank of lamps on one side of the semiconductor wafer. The other side of the wafer could then be used for various shafts which penetrated through the chamber walls to mechanically rotate the wafer with respect to the lamps. The prior art is deficient in that the systems are expensive and difficult to seal. The prior art systems also allow contaminants scrubbed from the relatively moving parts to contaminate the chamber. The prior art systems can not be used with banks of lights on either side of the wafer since the shaft, the rotating base holding the wafer, and the fittings necessary to allow the shaft to rotate with respect to the chamber block or otherwise interfere with light from the bank on the same side of the wafer as the shaft, and the resulting light impinging on the wafer is no longer uniform.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. US Patent 5,580,830 teaches the importance of the gas flow and the use of an aperture in the door to regulate gas flow and control impurities in the process chamber.

The importance of measuring the temperature of the wafer using a pyrometer of very broad spectral response is taught in U.S. Pat. No. 5,628, 564.

A method and apparatus for improved temperature control is taught in U.S. Pat. No. 5,841,110.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Patent application Ser. No. 08/537,409, now U.S. Pat. No. 5,841,110 teaches the importance susceptor plates separated from the wafer.

Rapid thermal processing of III-IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Patent application Ser. No. 08/631, 265, now U.S. Pat. No. 5,837,555, supplies a method and apparatus for overcoming this problem.

A method of raising the emissivity of a lightly doped, relatively low temperature wafer by locally heating the wafer with a pulse of light is disclosed in application Ser. No. 08/632,364, now U.S. Pat. No. 5,727,017.

An inflatable seal for an RTP system is disclosed in copending allowed application Ser. No. 08/895,655, filed Jul. 17, 1997, by Aschner et al.

A method, apparatus, and system for RTP an object is disclosed in copending application Ser. No. 08/953,590, filed Oct. 17, 1997, by Lerch et al.

A method of RTP of a substrate where a small amount of a reactive gas is used to control the etching of oxides or semiconductor is disclosed in copending application Ser. No. 08/886,215, by Nenyei et al, filed Jul. 1, 1997.

A method of RTP of a substrate where evaporation of the silicon is controlled is disclosed in copending application Ser. No. 09/015,441, by Marcus et al. filed Jan. 29, 1998.

Methods of rotating the wafer in an RTP system are disclosed in applications Ser. Nos. 08/960,150 and 08/977, 019 by Blersch et al. and Aschner et al. filed on Oct. 29. 1997 and Nov. 24, 1997 respectively.

The above identified patents and applications are assigned to the assignee of the present invention and are hereby incorporated herein by reference.

SUMMARY OF THE INVENTION

According to this invention, the object to be processed in an RTP system is placed on a rotating susceptor which is protected from warping due to uneven heating of the susceptor from radiation from the hot object.

DETAILED DESCRIPTION OF THE INVENTION

Figure 1:
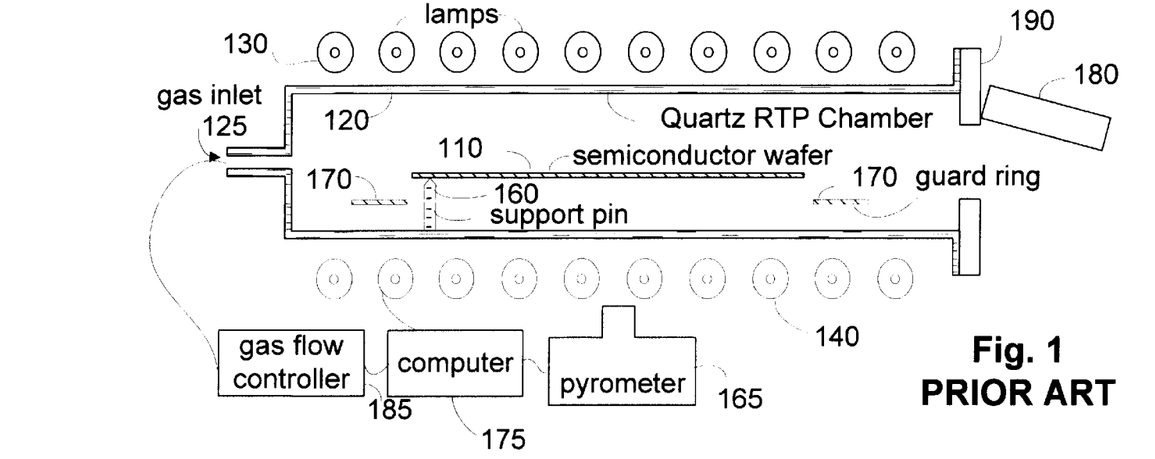
FIG. 1 shows a prior art RTP processing system.

FIG. 1 shows a prior art RTP processing system. A semiconductor wafer 110 or other object to be processed is supported in a quartz RTP chamber 120 by quartz support pins 160 (only one shown). A guard ring 170 is used to lessen edge effects of radiation from the edge of the wafer 110. An end plate 190 seals to the chamber 120, and a door 180 allows entry of the wafer 110 and, when closed, allows the chamber to be sealed and a process gas 125 to be introduced into the chamber. Two banks of radiation sources 130 and 140 are shown on either side of the wafer 110. A computer 175 or other control means as are known in the art is used to control the lamps 130 and 140, and to control the gas flow controller 185, the door 180, and the temperature measuring system, denoted here as a pyrometer 165. The gas flow may be an inert gas which does not react with the wafer, or it may be a reactive gas such as oxygen or nitrogen which reacts with the material of the semiconductor wafer to form a layer of on the semiconductor wafer, or the gas flow may be a gas which may contain a silicon compound which reacts at the heated surface of the object being processed to form a layer on the heated surface without consuming any material from the surface of the object. When the gas flow reacts to form a layer on the surface, the process is called rapid thermal—chemical vapor deposition (RT-CVD). An electrical current may be run through the atmosphere in the RTP system to produce ions which are reactive with or at the surface, and to impart extra energy to the surface by bombarding the surface with energetic ions.

Figure 2:
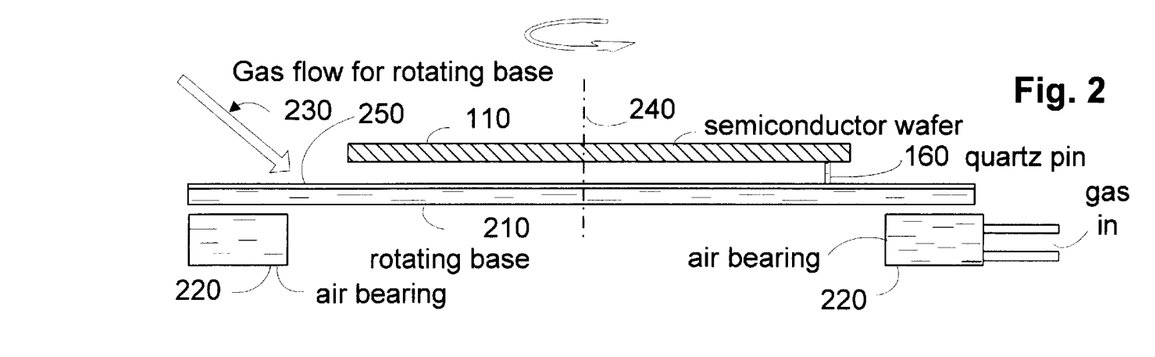
FIG. 2 shows a rotating base or susceptor 210 holding a wafer 110.

FIG. 2 shows a rotating base or susceptor 210 holding a wafer 110. Such a rotating base driven by a gas flow has been described in great detail in application Ser. No. 08/977,019 by Aschner et al. filed on Nov. 24, 1997. The base 210 is supported by air bearings 220. A gas flow 230 impinging on the rotating base causes the base to rotate about axis 240. A means for centering the base 210 is not shown in FIG. 2. When the device described in application Ser. No. 08/977,019 is used for heating wafer 110 to high temperatures and relatively long times, the infra red radiation from the hot wafer 110 is partially absorbed by the base which is made of quartz or other material transparent to the radiation from the lamps 140 and may cause warping of the base so that the flat surfaces of the base needed to ride on the air bearings 220, and the rotation may stop. The present invention details apparatus and methods to prevent such warping. One such method of preventing absorption and warping is shown in FIG. 2, where a layer 250 is shown deposited on or part of base 210. The layer 250 may be a reflective layer which reflects the infrared radiation from the wafer, but transmits the visible and near infrared radiation from the lamps 140. Such a reflective layer may be uniform over the base as shown, or it may be non uniformly applied to counteract the non-uniformity of the infrared radiation from the wafer impinging on the base. The layer 250 may also be an absorbing layer which absorbs radiation in a pattern to counteract the non uniform radiation from the wafer 110. Another preferred embodiment of the invention is to dope the quartz glass of the base 210 with atoms or molecules which absorb radiation from the wafer, so that a radial gradient in concentration of the molecules or atoms, preferably increasing from the inner to the outer portions of the base 210, is provided. The doping will result in a more uniform radial temperature profile of the base 210, if the base is non uniformly irradiated mainly in the center region. Due to the more uniform radial temperature distribution of the base 210, buckling of the wafer and the base is prevented.

Figure 3:
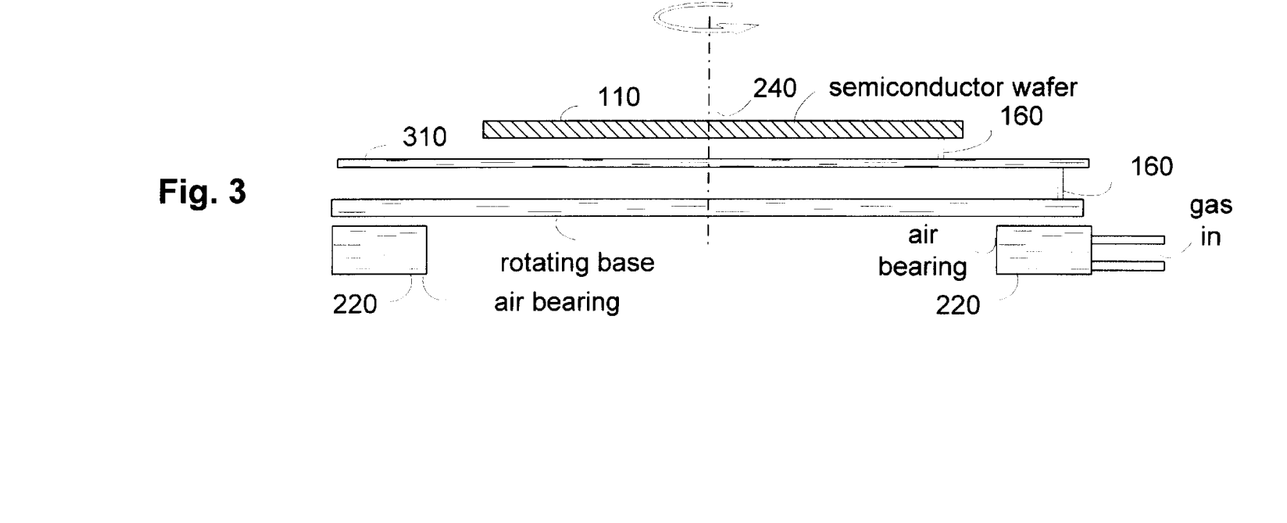
FIG. 3 shows an alternative embodiment of the invention.

FIG. 3 shows an alternative embodiment to prevent the infra red radiation from the wafer 110 heating and warping the base 210. A plate 310 is interposed between wafer 110 and base 210 which absorbs radiation from the wafer 110 and prevents the infra red radiation from heating the base 210. The plate 310 is preferably made of quartz, so that the heating radiation from the lamps 140 will be transmitted, while the longer wavelength radiation from the wafer 110 will be absorbed. The plate 310 may also be coated with a reflective or absorptive layer to control the temperature distribution of the plate 310 and the base 210. A further solution is to dope the quartz glass of the plate 310 with atoms or molecules to get a radial gradient in concentration of the molecules or atoms which absorb radiation from the wafer, preferably increasing from the inner to the outer portions of the plate 310. The doping will result in a more uniform radial temperature profile of the susceptor 310, if the susceptor is non uniformly irradiated mainly in the center region. Due to the more uniform radial temperature distribution of the plate 310, buckling of the wafer is prevented. The diameter of plate 310 is preferably approximately the same as the diameter of the wafer 110.

Figure 4:
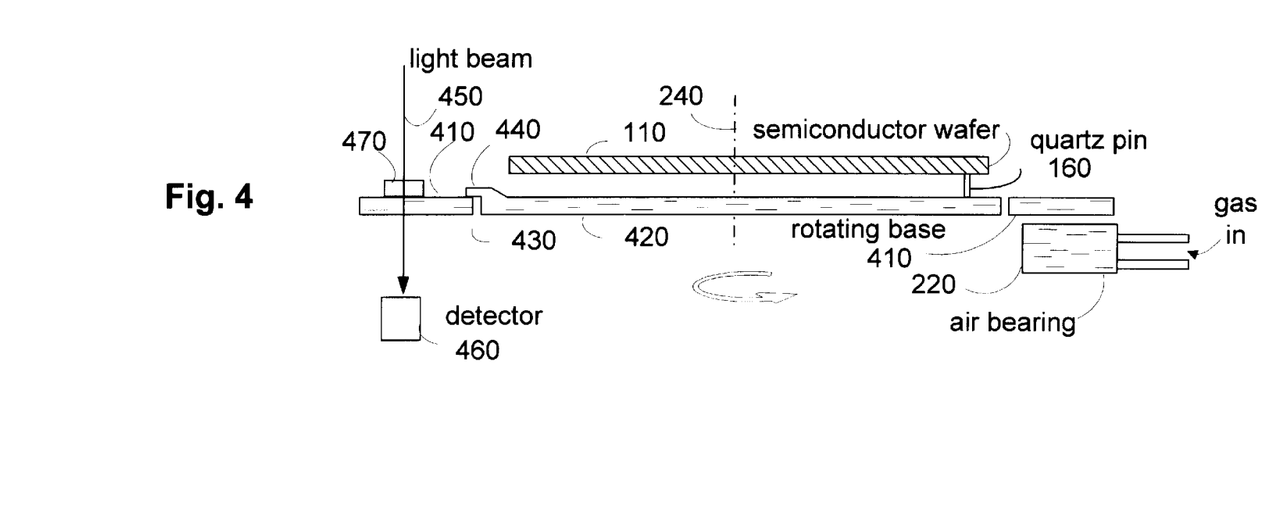
FIG. 4 shows a cross section of the most preferred embodiment of the invention.

FIG. 4 shows a cross section of the most preferred embodiment of the invention. The rotating base 410 of the invention is a ring which is supported by the air bearings 220. The ring supports a plate 420 which is supported at a plurality of points 430. The plate 420 is shown having a plurality of projections 440 for support (only one shown). Now, when plate 420 is heated by radiation from wafer 110, it may expand within the ring of base 410, and base 410 which receives relatively little radiation from wafer 110 will not be under so much stress to warp and cause problems riding on air bearings 220. While projections 440 are shown attached to plate 410, such projections could equally well be attached to base 410 to support plate 420 from the bottom. Once again, a centering post or detent arrangement which forces the base 410 and plate 420 to rotate about axis 240 is not shown.

FIG. 4 also shows a method of determining the angular position of base 410. A light beam 450 shines through the base 410 and is detected by a detector 460. Features 470 are placed on base 410 which change the light beam and thus may be detected by detector 460. The preferred features are sandblasted features, which scatter the light beam 450 but do not otherwise interfere with the radiation from the lamps 140. The most preferred features are the teeth of application Ser. No. 08/977,019 which have been sandblasted to interrupt light from a laser. As a convenience, there are 360 teeth arranged equidistant around the circumference of base 410. An extra tooth is additionally used inserted in between two of the 360 teeth to produce an extra reference signal. Other preferred features may be absorptive features or reflective features. Features 470 may also be magnetic features which may be detected by a magnetic detector in place of an optical detector.

In order to prevent plate 420 rotating with respect to base 410, plate 420 may engage base 410 with a tooth projecting from plate 420 into a detent in base 410, or with the projections 440 engaged in detents in base 410, or any suitable combination or other means as would be obvious to one skilled in the art.

To prevent imbalance of the ring 410 and the plate 420, the features of the apparatus such as the projections 440, the pin holding means for holding pins 160, the detent in base 410, the extra tooth of plate 410 are arranged in a suitable way to balance the whole apparatus.

Figure 5:
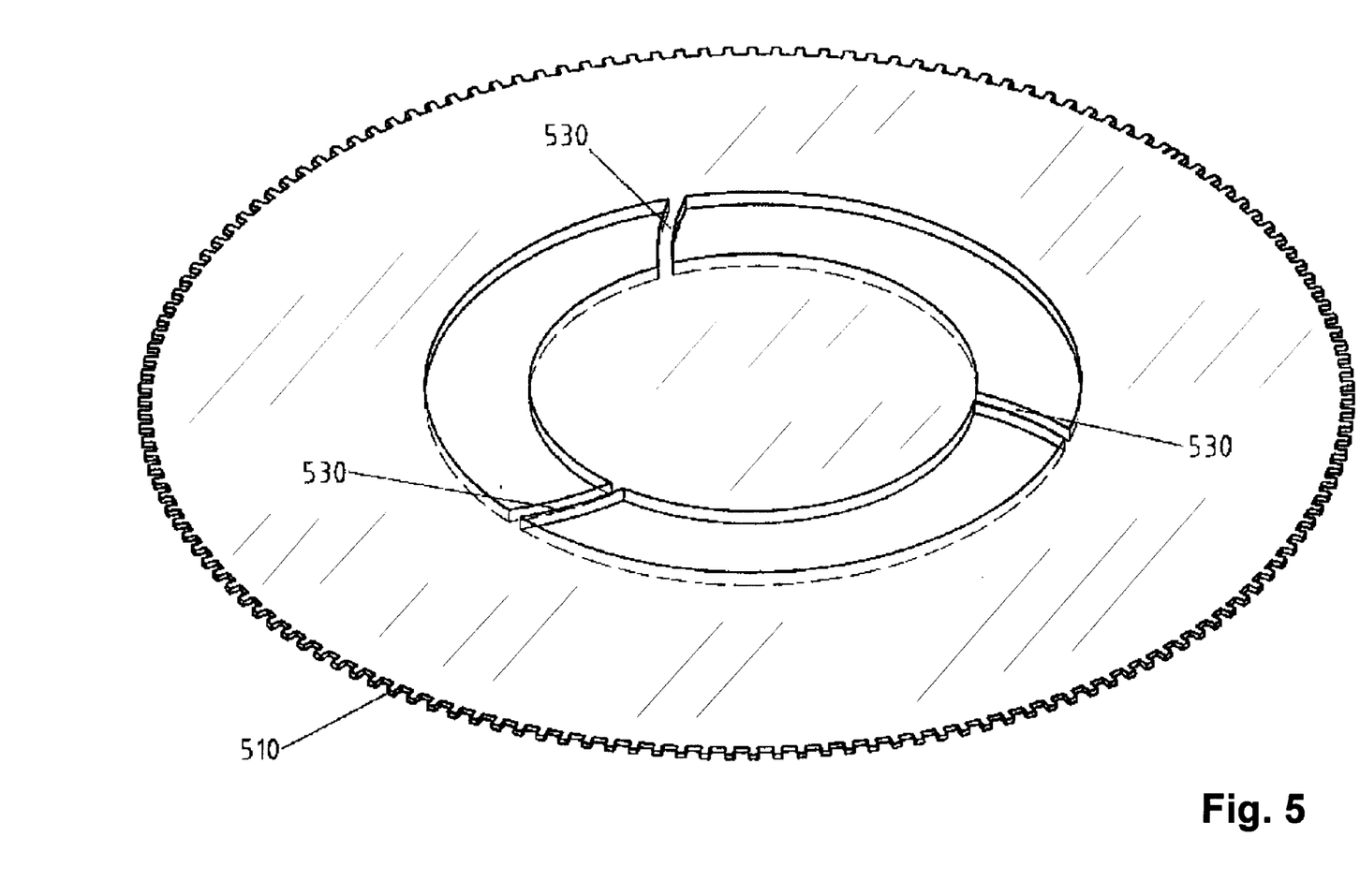
FIG. 5 shows an alternative embodiment of the invention.

An alternative embodiment of the invention is shown in FIG. 5. A base 510 in the form of a ring is joined to a plate 520 by a plurality of rods 530. The rods 530 are sufficiently elastic to ensure that little stress is placed on base 510 when plate 520 is heated by radiation from the wafer.

Figure 6:
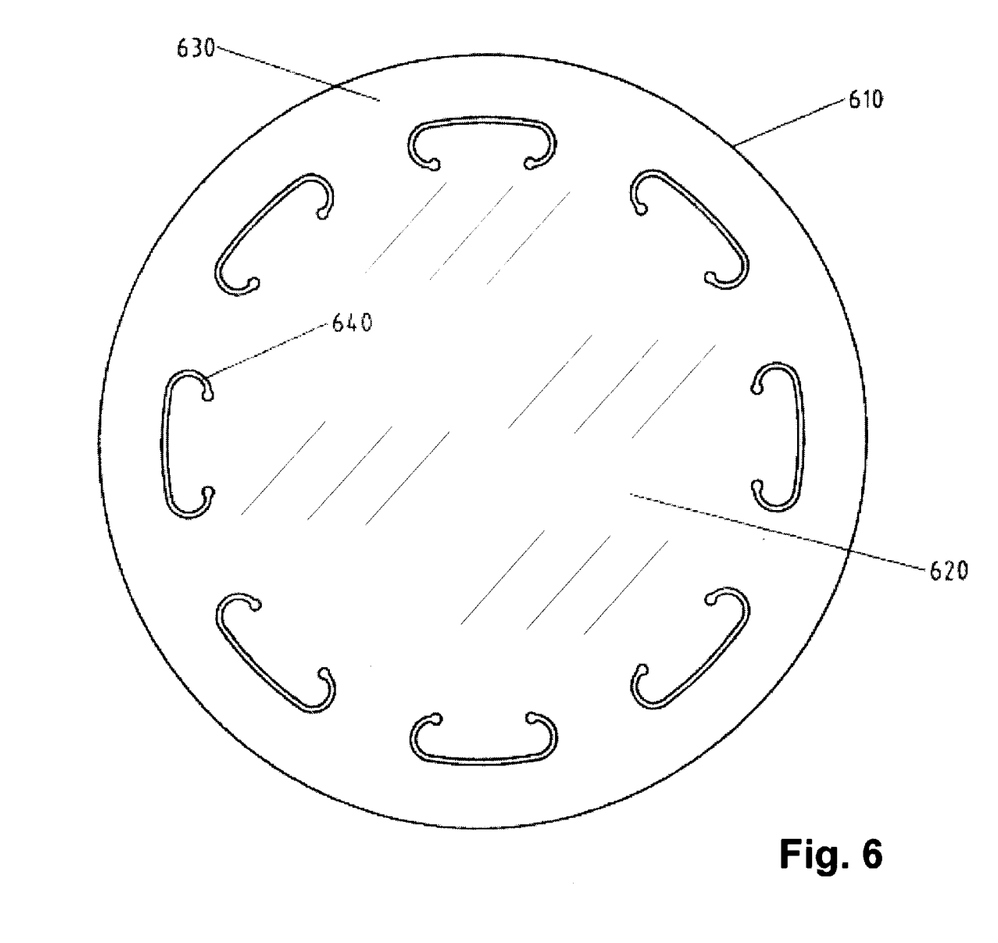
FIG. 6 shows an alternative embodiment of the invention.

An alternative embodiment of the invention is shown in FIG. 6. A base 610 has a series of cuts 640 formed in the plate to ensure that stress will not be transmitted from the inner part 620 to the outer part 630.

The advantage of the embodiments described in FIGS. 2, 5, and 6 is that the distortion of the rotatable substrate is extremely reduced, since the inner part of the rotating system is mechanically decoupled from the outer part, but the outer part is the essential part of the rotation means regarding the functionality of the air bearings. As a result, the bearing surfaces of the outer parts remain very parallel to the surfaces of the air bearings, even if the diameter of the rotating system is large or if the temperature of the wafer and inner parts of the rotation means is very high.

Figure 7:
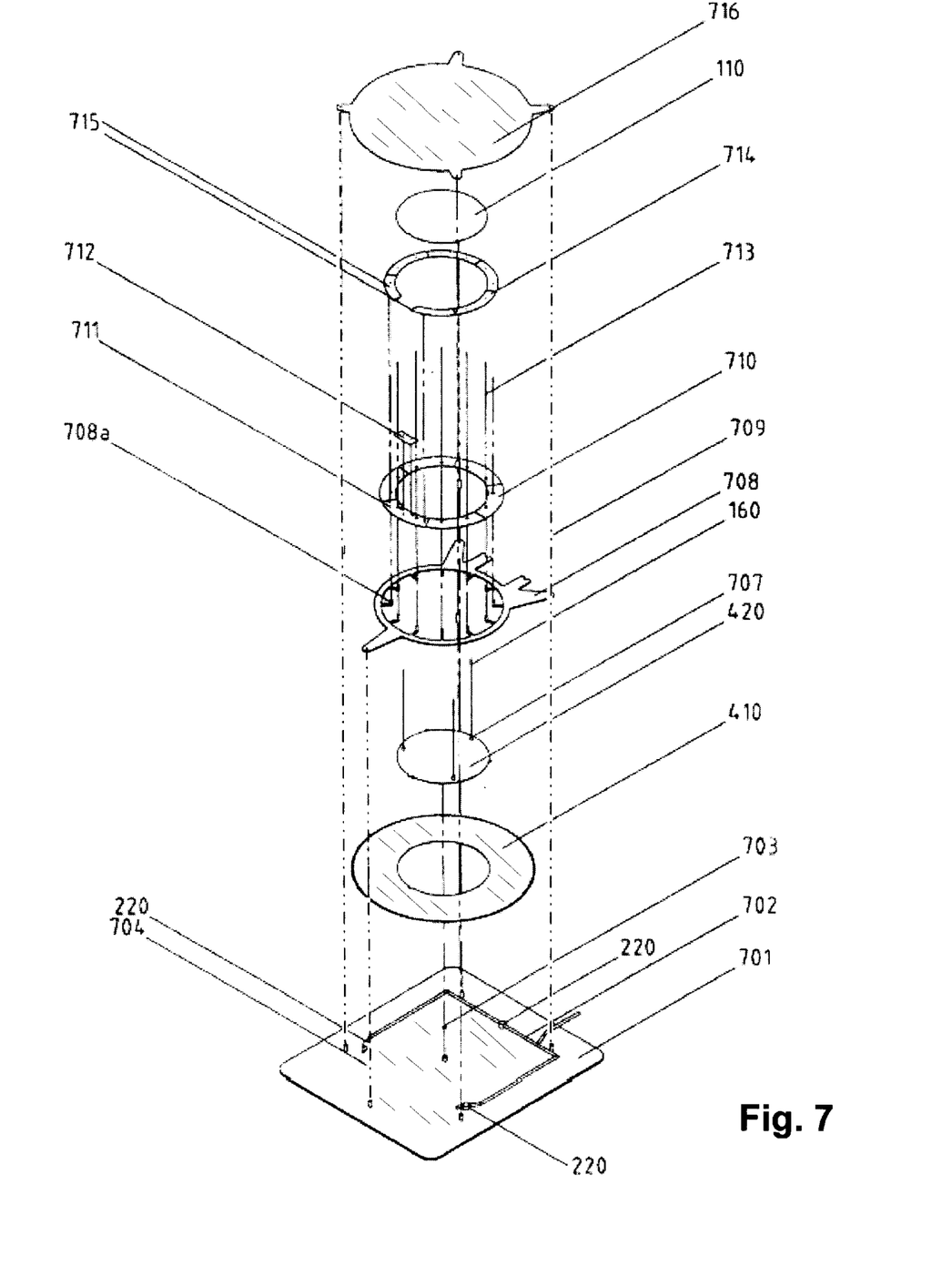
FIG. 7 shows an expanded view of an enhanced version of the most preferred embodiment of the invention.
Figures 8A, 8B, 8C:
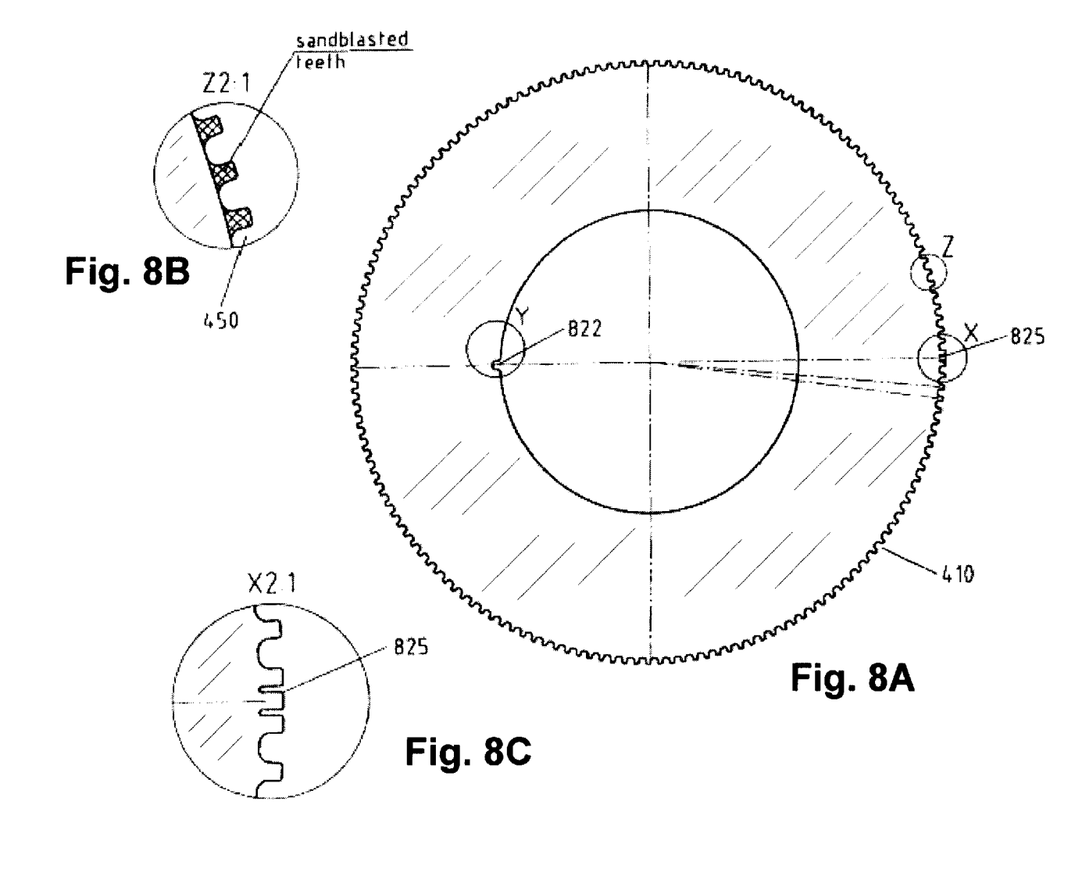
FIGS. 8A–E show detailed views of the most preferred embodiment of the invention.
Figures 8D, 8E:
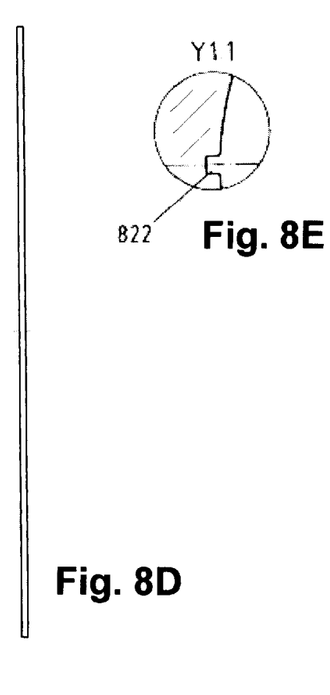
Figures 9A, 9B, 9C, 9D, 9E, 9F, 9G:
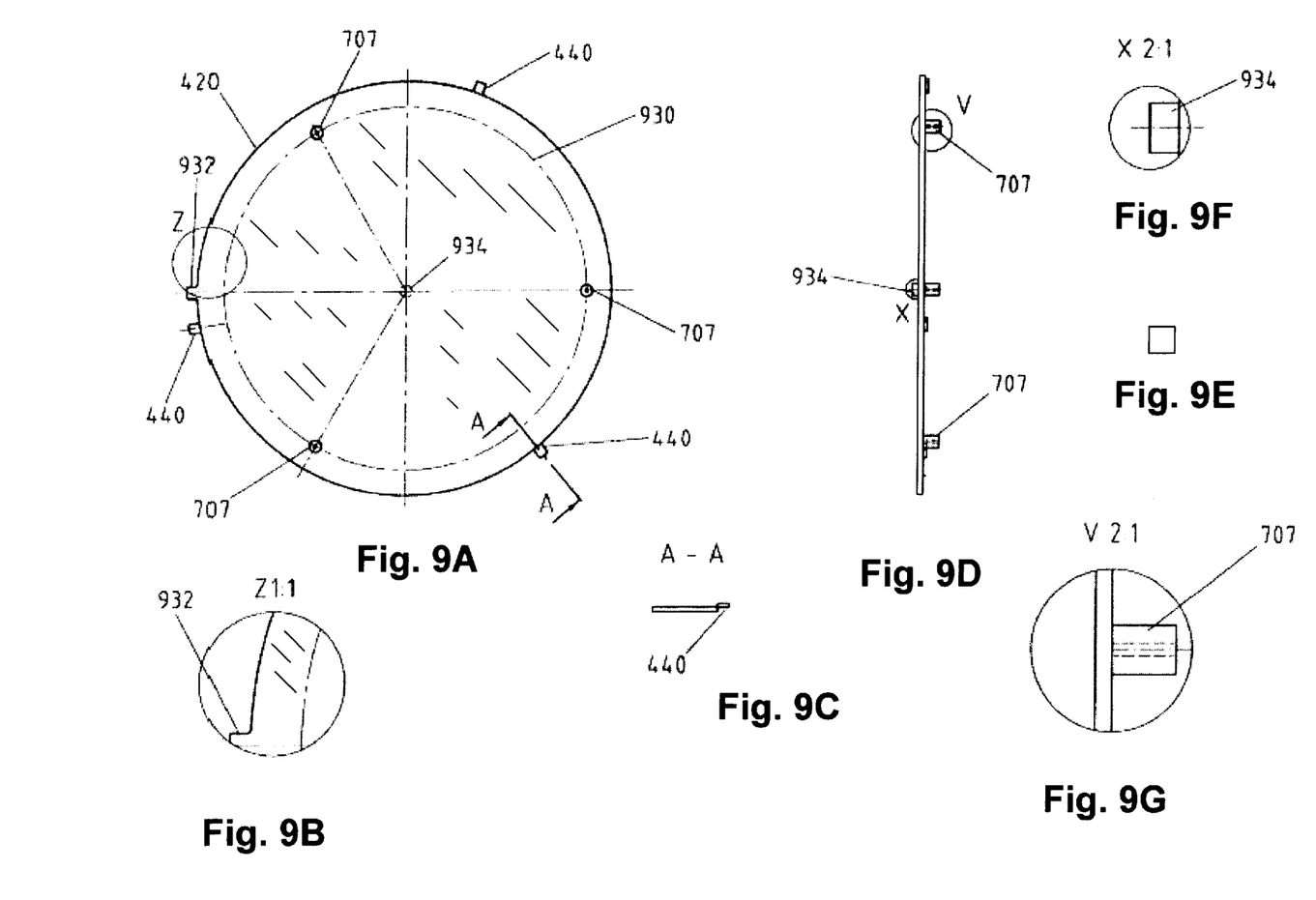
FIGS. 9A–G show detailed views of the most preferred embodiment of the invention.

FIG. 7 shows an expanded view of an enhanced version of the most preferred embodiment of the invention. A lower quartz plate 701 has gas lines 702 to deliver gas to gas bearings 220 A center bearing 703, preferably made of sapphire, serves to center the apparatus with respect to the plate 701. The base 410 and plate 420 of FIG. 4 ride on the air bearings and are rotated by gas blown from an external tube (not shown). A series of optional elements 707–716 are shown, which control the infra red radiation from the wafer 110. Elements 707 are hollow cylinders which hold pins 160 to support wafer 110. An additional holding means 708 holds a ring comprised of segments such as 710 and 711. Holding means 708 and ring segments 710 and 711 do not rotate, but are held by plate 701. The ring segments 710 and 711 are preferably made from quartz, and shield the rotating base 410 from radiation reflected and radiated from the wafer 110 and especially from the guard ring, 714, 715, and 712. The guard ring, 714, 715, and 712 is shown made from segments. The ring 710 and 711 and the guard ring, 714, 715, and 712 are made from segments for cost reasons, and for ease of replacement if one segment is broken. However, these rings could be made from single pieces of material. The guard ring, 714, 715, and 712 is preferably made from silicon, and the silicon is preferably coated to make sure that the guard ring is stable and the reflectivity and absorption characteristics do not change with time.

The holding means 708 is engaged with the quartz plate 701 via pins 704 and 709. The ring segments 710 and 711 are supported on the hollow cylindrical shaped pins 708A of the holding means 708. Pins 713 are inserted into the hollow pins 708A, and project through the ring segments 710 and 711 to support the guard ring segments 712, 714, and 715. One segment 712 is shown displaced from the plane of the other segments 714 and 715 to show that a segment may optionally be placed out of the plane (either higher or lower) of the guard ring to allow withdrawal of a robot arm which has introduced wafer 110 into the system and lowered it so that wafer 110 is coplanar with guard ring segments 714 and 715.

An additional quartz plate 716 resting on quartz pins 709 has the advantage that turbulence of the hot gas above the wafer is minimized.

FIGS. 8A–E and 9A–G show detailed views of the most preferred embodiment of the invention. In particular, a notch 822 in ring 410 received a tooth 932 on plate 420 so that ring 410 may drive plate 420. Also shown are the sandblasted teeth 450, and an extra tooth 825 which gives the computer a calibration point from which to count the number of teeth rotating past the optical detection means.

Obviously, many modifications and variations of the present invention are possible in light of the above teachings. It is therefore to be understood that, withing the scope of the appended claims, the invention may be practiced otherwise then as specifically described.

We claim:
1. An apparatus, comprising;
  a rotatable base, the base for supporting an object being processed in a Rapid Thermal Processing (RTP) System equipped with air bearings for supporting the rotating base, the base comprising;
    an outer part, forming bearing surfaces for bearing on the air bearings; and
    an inner part, the inner part supported by the outer part, the inner part mechanically decoupled from the outer part to prevent warping of the base due to non-uniform heating of the base by radiation from the object being processed, so that the bearing surfaces of the outer part remain very parallel to the surfaces of the air bearings during rapid thermal processing of the object.

2. The apparatus of claim 1, wherein the base is rotated by impinging a flowing fluid on the base.

3. The apparatus of claim 1, wherein the inner part is mechanically decoupled from the outer part by a slot cut in the base.

4. The apparatus of claim 1, wherein inner part comprises a plate separate from outer part, the plate supported by the outer part at a plurality of points, the plate supporting the object.

5. The apparatus of claim 4, wherein the plate is engaged with the outer part so that orientation of the plate with respect the base outer part is constant as the base outer part rotates.

6. The apparatus of claim 1, wherein inner part comprises a plate joined to the outer part at a plurality of points by joining means which allow relative expansion between the base and the plate.

7. The apparatus of claim 1, wherein the angular position of the base is determined by optical means.

8. The apparatus of claim 1, wherein the angular position of the base is determined by magnetic means.

9. A method of rapid thermal processing (RTP) of an object, comprising:
  supporting the object on a rotatable base, the rotatable base supported by air bearings;
  processing the object with radiation from radiation sources of an RTP system while rotating the object on the rotatable base,
  wherein the rotatable base comprises an outer part forming bearing surfaces for bearing on the air bearings, and an inner part; wherein the bearing surfaces of the outer part are kept very parallel to the surfaces of the air bearings by a first means which mechanically decouples the inner part from the outer part to prevent warping of the base due to non-uniform heating of the base by radiation from the object being processed.

10. The method of claim 9, wherein the base is rotated by impinging a flowing fluid on the base.

11. A system comprising;
  a rapid thermal processing system;
  air bearings for supporting a rotatable base in the processing chamber of the RTP system,
  a rotatable base, the base for supporting an object being processed in the Rapid Thermal Processing (RTP) System, the base comprising;
    an outer part, forming bearing surfaces for bearing on the air bearings; and an inner part, the inner part supported by the outer part, the inner part mechanically decoupled from the outer part to prevent warping of the base due to non-uniform heating of the base by radiation from the object being processed, so that the bearing surfaces of the outer part remain very parallel to the surfaces of the air bearings during rapid thermal processing of the object.

* * * * *